United States Patent
Ando

(10) Patent No.: US 10,394,196 B2
(45) Date of Patent: Aug. 27, 2019

(54) NUMERICAL CONTROL SYSTEM FOR DETECTING DEFECTS

(71) Applicant: FANUC CORPORATION, Minamitsuru-gun, Yamanashi (JP)

(72) Inventor: Hiroshige Ando, Yamanashi (JP)

(73) Assignee: Fanuc Corporation, Yamanashi (JP)

(*) Notice: Subject to any disclaimer, the term of this patent is extended or adjusted under 35 U.S.C. 154(b) by 234 days.

(21) Appl. No.: 15/277,310

(22) Filed: Sep. 27, 2016

(65) Prior Publication Data
US 2017/0090436 A1 Mar. 30, 2017

(30) Foreign Application Priority Data
Sep. 28, 2015 (JP) .................. 2015-189541

(51) Int. Cl.
*G05B 13/04* (2006.01)
*G05B 19/4063* (2006.01)
*G06F 17/50* (2006.01)
*G05B 23/02* (2006.01)

(52) U.S. Cl.
CPC ....... *G05B 13/041* (2013.01); *G05B 19/4063* (2013.01); *G05B 23/0243* (2013.01); *G06F 17/50* (2013.01); *G05B 2219/31359* (2013.01); *G05B 2219/33327* (2013.01); *G05B 2219/35502* (2013.01); *G05B 2219/50129* (2013.01)

(58) Field of Classification Search
CPC .............. G05B 13/041; G05B 19/4063; G05B 23/0243; G05B 2219/31359; G05B 2219/33327; G05B 2219/35502; G05B 2219/50129; G06F 17/50

USPC .......................................................... 700/98
See application file for complete search history.

(56) References Cited

U.S. PATENT DOCUMENTS

| 2003/0115510 A1 | 6/2003 | Takayama |
| 2006/0181426 A1 | 8/2006 | Ando et al. |
| 2008/0294805 A1* | 11/2008 | Sone .................... G05B 19/058 710/19 |
| 2009/0051367 A1* | 2/2009 | Hada .................. G05B 19/0425 324/537 |
| 2013/0245788 A1* | 9/2013 | Miyazaki ............... G05B 19/18 700/11 |
| 2014/0163698 A1 | 6/2014 | Kato et al. |

(Continued)

FOREIGN PATENT DOCUMENTS

| JP | 63113708 A | 5/1988 |
| JP | 05150818 A | 6/1993 |
| JP | H 06-282609 A | 10/1994 |

(Continued)

OTHER PUBLICATIONS

Notification of Reasons for Refusal for Japanese Application No. 2015-189541, dated Oct. 31, 2017 with translation, 6 pages.

*Primary Examiner* — Nathan L Laughlin
*Assistant Examiner* — Jigneshkumar C Patel
(74) *Attorney, Agent, or Firm* — RatnerPrestia

(57) ABSTRACT

A numerical control system includes a computer aided design (CAD) data storage means for storing CAD data, an input/output (I/O) assignment data storage means for storing I/O assignment data, and a relevant information storage means for recording relevant information between the I/O assignment data and mounting information included in CAD data of each of the I/O units, and displays a defect occurrence region on a shape image of a control panel.

5 Claims, 2 Drawing Sheets

(56) References Cited

U.S. PATENT DOCUMENTS

2015/0105874 A1\* 4/2015 Miyazaki ............... G05B 15/02
700/80

FOREIGN PATENT DOCUMENTS

| JP | H 07-152797 A | 6/1995 |
| JP | H 10-40276 A | 2/1998 |
| JP | 2003177815 A | 6/2003 |
| JP | 2003295915 A | 10/2003 |
| JP | 2006209483 A | 8/2006 |
| JP | 4291384 B2 | 4/2009 |
| JP | 5113676 B2 | 10/2012 |
| JP | 2014115742 A | 6/2014 |
| JP | 2015079342 A | 4/2015 |

\* cited by examiner

NUMERICAL CONTROL SYSTEM FOR DETECTING DEFECTS

BACKGROUND OF THE INVENTION

1. Field of the Invention

The present invention relates to a numerical control system, and particularly relates to a numerical control system that enables a position of an input/output (I/O) unit at which a defect occurs to be easily detected.

2. Description of the Related Art

A configuration, in which a plurality of external signal input/output units (I/O units) is connected, has been employed to input and output a digital input/digital output (DI/DO) signal (input signal/output signal) between a numerical controller and a machine tool. Normally, DI/DO data (input data/output data) is exchanged between a numerical controller and an I/O unit. In such a configuration, when a defect such as cable disconnection between I/O units or instantaneous interruption of power supply of an I/O unit is detected, for example, a conventional art such as JP 4291384 B2 is publicly known as a method of discriminating a cause of the defect and a place in which the defect occurs.

In general, I/O units are mounted inside a control panel of a machine tool such that each of the I/O units is dispersed. In addition to the I/O units, a terminal block corresponding to input/output destinations of the I/O units, a relay, an electromagnetic switch, a sensor, etc. are mounted inside the control panel. In addition, a power supply, a servo amplifier, and a controller of the numerical controller may be mounted. With regard to wiring of a cable that connects these devices to each other, it is desirable that each group of devices corresponding to cables having close electric potentials be combined and separated from another group in consideration of a measure against noise. Since the above-described design constraints are present, a computer aided design (CAD) for mechanical design and electric design is used in some cases to support mounting and disposition of various devices inside the control panel or design of wiring between devices in the design and manufacture of the control panel (for example, JP 07-152797 A, JP 5113676 B2, JP 10-040276 A, JP 06-282609 A, etc.).

However, a fault detecting function disclosed in JP 4291384 B2 can accurately discriminate a cause and a location of a fault in a case in which a defect such as cable disconnection between I/O units or instantaneous interruption of power supply of an I/O unit is detected. Since various devices are mounted and disposed inside a control panel, an actual location of a fault inside the control panel may not be specified when a mounting diagram or a circuit diagram is not checked.

In addition, an application for displaying disposition of various devices inside a control panel on a screen may be prepared to visually display a location of a fault. In this case, a screen corresponding to disposition inside the control panel which is different among individual machines may need to be prepared, and introduction thereof is time-consuming.

SUMMARY OF THE INVENTION

In this regard, an object of the invention is to provide a numerical control system that enables a position of an I/O unit at which a defect occurs to be easily detected.

In the invention, CAD data used for mounting design and wiring design of a control panel is read by a numerical controller, and the CAD data is associated with I/O assignment data related to a connection order between I/O units. When a place of a fault is detected, display data inside the control panel is prepared and displayed with reference to the associated information.

A numerical control system of the invention is a numerical control system configured by connecting a numerical controller to a plurality of I/O units mounted inside a control panel of a machine tool, the numerical control system including a CAD data storage means for storing CAD data for control panel design, the CAD data storage means including shape information indicating an external shape and an internal structure of the control panel and mounting information indicating at least a location and a direction, an I/O unit inside the control panel being mounted at the location and installed in the direction, an I/O assignment data storage means for storing I/O assignment data recording a connection state of the I/O unit, a relevant information storage means for recording relevant information between the I/O assignment data and the mounting information of each of the I/O units, a fault detection means for detecting a defect occurrence region, a defect of the numerical controller or the I/O unit occurring in the defect occurrence region, and a display means for preparing display data displaying the defect occurrence region on a shape image of the control panel based on information related to the defect occurrence region, the I/O assignment data, the relevant information, and the CAD data.

The plurality of I/O units may be daisy-chained to the numerical controller, and the I/O assignment data may be a connection order of the I/O unit.

The fault detection means may detect at least power discontinuity of the I/O unit.

The fault detection means may detect at least cable disconnection between the numerical controller and the I/O unit and between the I/O units.

In the numerical control system, the mounting information may include information about a wiring route of a cable between the plurality of I/O units mounted inside the control panel.

According to the invention, when a fault related to an I/O unit occurs, an operator may more clearly detect a place of the fault without referring to a circuit diagram or a mounting diagram. In addition, since CAD data can be appropriated for preparation of an alarm display image at the time of the occurrence of a fault, the alarm display image may be easily prepared for each machine.

BRIEF DESCRIPTION OF THE DRAWINGS

The above-described and other objects and characteristics of the invention will be clear from description of an embodiment below with reference to accompanying drawings. In the drawings.

DETAILED DESCRIPTION OF THE PREFERRED EMBODIMENTS

This application claims the benefit of Japanese Patent Application No. 2015-1895413 filed on Sep. 28, 2015, the disclosure of which is incorporated in this application by reference.

Hereinafter, an embodiment of the invention will be described with drawings.

Figure 1:
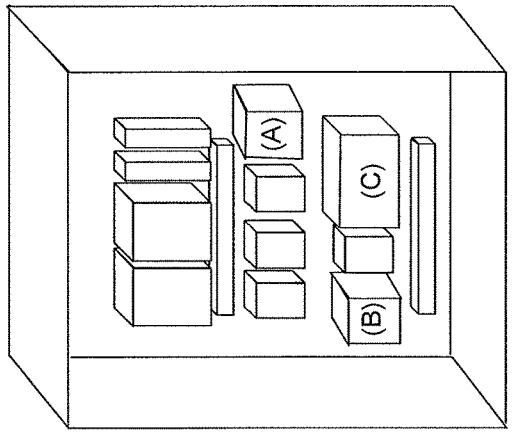
FIG. 1 is a schematic diagram illustrating a flow of preparation of an alarm image in a numerical control system of an embodiment of the invention.
Figure 1:
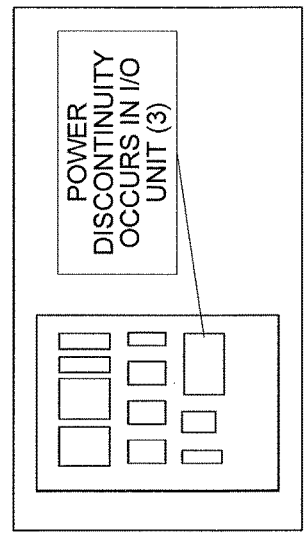
Figure 1:
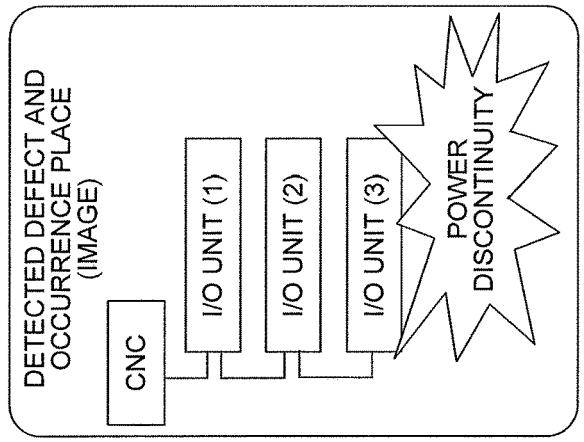

FIG. 1 is a schematic diagram illustrating a flow of preparation of an alarm image in a numerical control system of an embodiment of the invention. The numerical control system of the present embodiment is configured by connecting a numerical controller to a plurality of I/O units mounted inside a control panel of a machine tool. The numerical controller stores CAD data for control panel design prepared at the time of mounting design and wiring design of a control panel of a machine to be controlled. The CAD data includes data of mounting information related to a mounting location or direction of an I/O unit inside a control panel, data related to a connection order between I/O units, data related to a wiring route of a connecting wire, etc., and display data inside the control panel may be prepared based on the data.

When the numerical controller is connected to the plurality of I/O units, daisy chain is performed such that the numerical controller and a first I/O unit are connected to each other, and the first I/O unit and a second I/O unit are connected to each other, etc. An identifier such as a number is assigned to each I/O unit to exchange data such as a signal between the numerical controller and the plurality of I/O units which are daisy-chained. In addition, a connection order of each I/O unit can be detected from the numerical controller using the assigned identifier.

The numerical controller of the present embodiment includes a relevant information table, which stores an identifier of each I/O unit in the mounting information included in the above-described CAD data (denoted by (A), (B), and (C) in FIG. 1) and an identifier assigned to each I/O unit (denoted by (1), (2), and (3) in FIG. 1) in an associated manner, in a memory. In addition, when a defect (power discontinuity, wiring disconnection, etc.) occurs in a power supply of an I/O unit, a wire between the numerical controller and an I/O unit, or a wire between respective I/O units, the numerical controller acquires an identifier of an I/O unit in corresponding mounting information with reference to the relevant information table using a location at which the defect occurs (detected by an identifier assigned to the I/O unit). The numerical controller prepares shape display data of the control panel based on the acquired identifier in the mounting information and respective data included in the CAD data such as data of mounting information related to a mounting location or direction of an I/O unit inside the control panel, data related to a connection order between I/O units, data related to a wiring route of a connecting wire, etc. In addition, the numerical controller prepares display data that indicates a location at which the defect is detected, prepares display data inside the control panel created by associating the shape display data with the display data, and displays the display data as an alarm image.

Referring to the display data that indicates the location at which the defect is detected, for example, a CAD component at the defect location may be highlighted and displayed based on a mounting location or direction of an I/O unit in mounting information, data of a shape of an I/O unit, data related to a wiring route, etc. In addition, as illustrated in FIG. 1, the display data may be display data of a balloon that reports occurrence content of a defect indicating a defect occurrence location.

When such display data is displayed as a warning image on a display device of the numerical controller at the time of detecting a defect, an operator can easily detect a defect occurrence location inside the control panel without referring to a circuit diagram or a mounting diagram.

Figure 2:
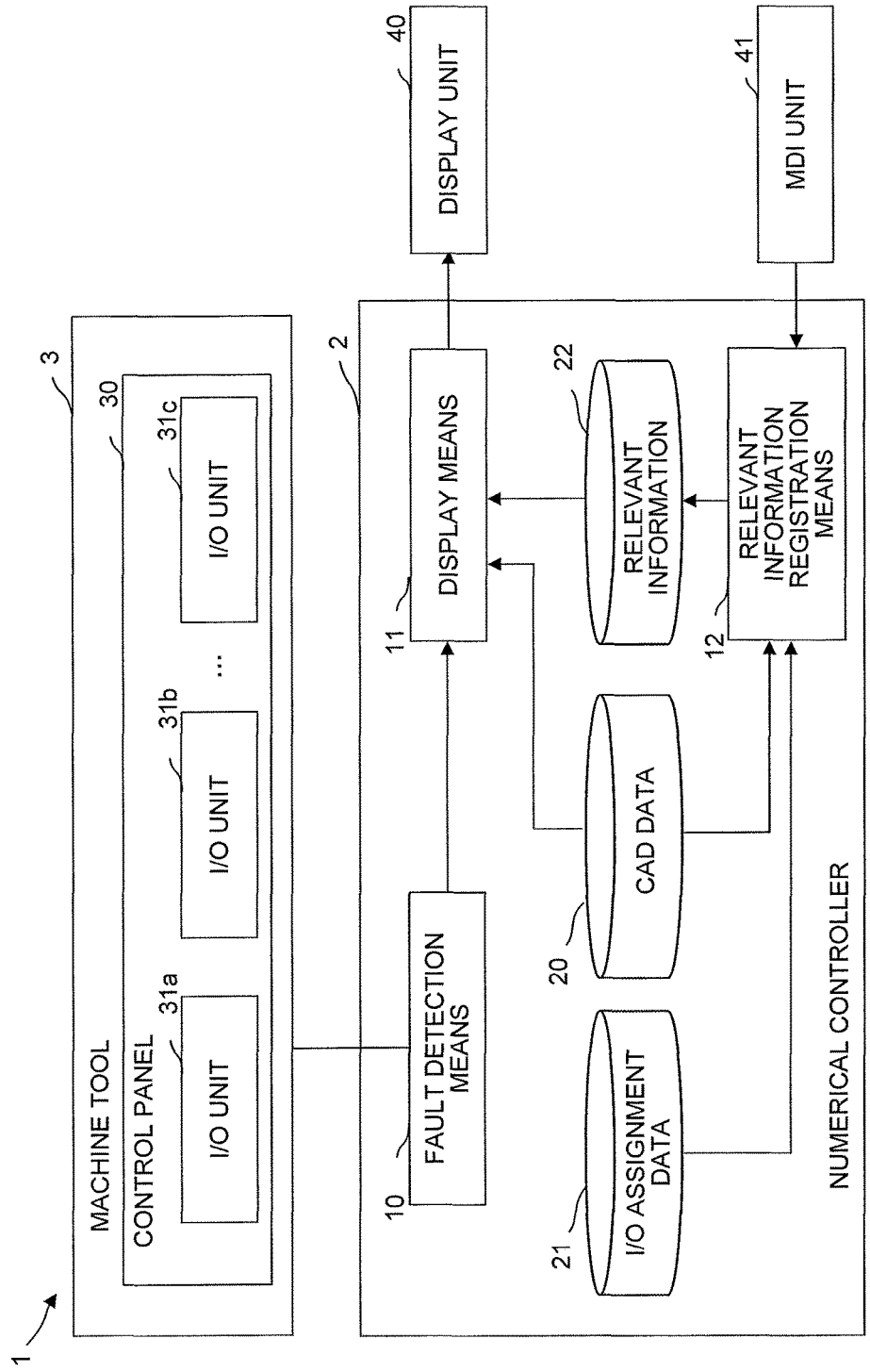
FIG. 2 is a schematic block diagram of the numerical control system in the embodiment of the invention.

FIG. 2 is a schematic block diagram of the numerical control system according to the embodiment of the invention. A numerical control system 1 of the embodiment is configured by connecting a numerical controller 2 to a plurality of I/O units 31a, 31b, 31c, . . . mounted inside a control panel 30 of a machine tool 3.

The numerical controller 2 includes a fault detection means 10, a display means 11, and a relevant information registration means 12, and further includes a CAD data storage means 20 that stores CAD data, an I/O assignment data storage means 21 that stores I/O assignment data, and a relevant information storage means 22 that stores relevant information.

The fault detection means 10 is a functional means that detects a defect (power discontinuity, wiring disconnection, etc.) occurring in the plurality of I/O units 31a, 31b, 31c, . . . mounted inside the control panel 30, a wire between the numerical controller 2 and an I/O unit, and a wire between the respective I/O units. The fault detection means 10 detects the occurrence of a defect using a type of the defect and an identifier assigned to each I/O unit, and outputs the type of the defect and the identifier of the I/O unit to the display means 11 described below. A technology publicly known by JP 4291384 B2, etc. may be employed as a method of detecting a defect, and a detailed description will be omitted in the present specification.

The display means 11 operates when the fault detection means 10 detects a defect in an I/O unit, and prepares display data indicating a defect occurrence region on a shape image of the control panel. Upon receiving the type of the defect and the identifier assigned to the I/O unit from the fault detection means 10, the display means 11 specifies an identifier of an I/O unit in mounting information associated with the identifier with reference to the relevant information table stored in the relevant information storage means 22 using the identifier. Then, the display means 11 prepares the display data indicating the defect occurrence region on the shape image of the control panel based on the specified identifier of the I/O unit in the mounting information, respective data stored in the CAD data storage means 20, and the type of the defect. A general image processing technology may be used to prepare the display data. Then, the prepared display data is displayed as an alarm image in a display unit 40 connected to the numerical controller 2.

The relevant information registration means 12 associates an identifier of each I/O unit in the mounting information included in the CAD data with an identifier assigned to each I/O unit, and stores the identifiers as relevant information in the relevant information table which is stored in the relevant information storage means 22. At the time of registering the relevant information, an MDI unit 41 is operated to start a relevant information registration function. Then, while an identifier of each I/O unit in the mounting information included in the CAD data and an identifier assigned to each I/O unit at the time of connection are displayed on the display unit, the MDI unit 41 is operated to register the respective identifiers while associating the identifiers with each other.

As a registration means for the relevant information, only a method of registering the relevant information on the numerical controller 2 may be used, or data of the relevant information edited by a personal computer, etc. may be read by the numerical controller 2 through a recording medium such as a memory card.

According to the numerical control system configured as described above, when a fault related to an I/O unit occurs, the operator may more clearly detect a place of the fault without referring to a circuit diagram or a mounting diagram. In addition, since CAD data can be appropriated for preparation of an alarm display image at the time of the occurrence of a fault, the alarm display image may be easily prepared for each machine.

Even though the embodiment of the invention has been described, the invention is not restricted to only an example of the above-described embodiment, and may be implemented in various modes by appropriately making an alteration.

The invention claimed is:

1. A numerical control system comprising:
a numerical controller;
a control panel of a machine tool; and
a plurality of input/output (I/O) units mounted inside the control panel of the machine tool, the plurality of (I/O) units configured for data transfer between the numerical controller and the control panel of the machine tool;
a computer aided design (CAD) data storage for storing CAD data for control panel design, the CAD data storage including shape information indicating an external shape and an internal structure of the control panel and mounting information indicating at least a location, an I/O unit inside the control panel being mounted at the location;
an I/O assignment data storage for storing I/O assignment data recording a connection state of the I/O unit;
a relevant information storage for recording relevant information between the I/O assignment data and the mounting information of each of the I/O units,
wherein the numerical controller is configured to:
control the machine tool to perform machining;
receive the data from at least one of the plurality of input/output (I/O) units mounted inside the control panel;
analyze the received data;
detect, based on the analysis of the received data, a defect occurrence region where a defect of the numerical controller or a defect the I/O unit is occurring; and
control a display to display the defect occurrence region on a shape image of the control panel based on information related to the defect occurrence region, the I/O assignment data, the relevant information, and the CAD data.

2. The numerical control system according to claim 1, wherein the plurality of I/O units is daisy-chained to the numerical controller, and the I/O assignment data is a connection order of the I/O unit.

3. The numerical control system according to claim 1, wherein the numerical controller detects at least power discontinuity of the I/O unit.

4. The numerical control system according to claim 1, wherein the numerical controller detects at least cable disconnection between the numerical controller and the I/O unit and between the I/O units.

5. The numerical control system according to claim 1, wherein the mounting information includes information about a wiring route of a cable between the plurality of I/O units mounted inside the control panel.

* * * * *